US 8,736,115 B2

(12) United States Patent
Fisher, Jr. et al.

(10) Patent No.: US 8,736,115 B2
(45) Date of Patent: May 27, 2014

(54) BUTTONS WITH MODULATED BIAS VOLTAGES

(75) Inventors: Joseph Fisher, Jr., San Jose, CA (US); Stephen Brian Lynch, Portola Valley, CA (US); Robert Caston Curtis, San Jose, CA (US)

(73) Assignee: Apple Inc., Cupertino, CA (US)

( * ) Notice: Subject to any disclaimer, the term of this patent is extended or adjusted under 35 U.S.C. 154(b) by 576 days.

(21) Appl. No.: 13/094,098

(22) Filed: Apr. 26, 2011

(65) Prior Publication Data

US 2012/0050964 A1 Mar. 1, 2012

Related U.S. Application Data

(60) Provisional application No. 61/378,899, filed on Aug. 31, 2010.

(51) Int. Cl.
*H02B 1/24* (2006.01)

(52) U.S. Cl.
USPC .......................................... 307/112

(58) Field of Classification Search
USPC .......................................... 307/112
See application file for complete search history.

(56) References Cited

U.S. PATENT DOCUMENTS

| 4,862,166 | A | 8/1989 | Yamakawa |
| 5,990,868 | A | 11/1999 | Frederick |
| 6,622,025 | B2 | 9/2003 | Lee |
| 7,158,056 | B2 | 1/2007 | Wright et al. |
| 7,533,193 | B2 | 5/2009 | Testin et al. |
| 2006/0255812 | A1 | 11/2006 | Martin et al. |
| 2007/0152974 | A1 | 7/2007 | Kim et al. |
| 2008/0242378 | A1 | 10/2008 | Lowles et al. |
| 2009/0272639 | A1 | 11/2009 | Mittleman et al. |
| 2009/0315411 | A1 | 12/2009 | Depew |
| 2011/0095877 | A1 | 4/2011 | Casparian et al. |

FOREIGN PATENT DOCUMENTS

| WO | 97/32426 A1 | 9/1997 |
| WO | 9732426 | 9/1997 |
| WO | 01/95499 A1 | 12/2001 |
| WO | 0195499 | 12/2001 |

OTHER PUBLICATIONS

European Search Report dated Dec. 13, 2011; Application No. EP11178118.

*Primary Examiner* — Stephen W Jackson
*Assistant Examiner* — Dru Parries
(74) *Attorney, Agent, or Firm* — Womble Carlyle Sandridge & Rice LLP

(57) ABSTRACT

Electronic devices may use buttons to gather user input. Button status monitoring circuits may be provided that apply a time-varying bias voltage to each button. The time-varying bias voltage may be held at a fixed non-zero level when the state of the button is being monitored and may be held at a level of zero volts when the state of the button is immaterial and is not being monitored. The reduction of the bias voltage across the button when the button is not being monitored prevents undesired acceleration in dendritic growth when the electronic device is exposed to moisture. The bias voltage may be pulsed by using a control circuit. The control circuit may generate a series of square wave pulses that are applied across the terminals.

20 Claims, 10 Drawing Sheets

BUTTONS WITH MODULATED BIAS VOLTAGES

This application claims the benefit of provisional patent application No. 61/378,899 filed Aug. 31, 2010, which is hereby incorporated by reference herein in its entirety.

BACKGROUND

This relates to electronic devices, such as electronic devices with buttons.

Electronic devices such as cellular telephones, computers, music players, and other devices often use buttons to gather user input. A typical button may have a movable button member that actuates a switch such as a dome switch. To ensure reliable operation, environmental sealing techniques are sometimes used to prevent moisture from damaging internal components. Despite these measures, dome switches and other button components may still be vulnerable to damage when exposed to moisture. This potential for failure is exacerbated by the use of direct current (DC) button biasing voltages. This is because the DC voltage encourages dendritic growth in the presence of moisture. Dendrites may cause undesirable short circuits and device failures.

It would therefore be desirable to provide improved button arrangements for electronic devices.

SUMMARY

Dendritic growth in electronic device buttons may be minimized by providing electronic devices with button monitoring circuits that use time-varying bias voltages. During some modes of operation the status of certain buttons may need to be monitored. For example, during normal operation, it may be desirable to monitor the status of a power button, a menu button, and volume buttons. In other modes of operation, such as in a sleep mode, it may not be necessary or desirable to monitor the status of one or more of these buttons. For example, it may be desirable to monitor only the status of the power and menu buttons and not the volume buttons. Because the volume buttons are not being monitored in the sleep state, the non-zero bias voltage that would otherwise be applied to the volume buttons can be replaced with a bias voltage of zero volts.

Mode-dependent adjustment of the pattern of bias voltages that are applied to the buttons allows unused buttons to be exposed to reduced voltages. This avoids the acceleration of dendritic growth that typically arises in the presence of voltage differences across button terminals when buttons are exposed to moisture.

The average voltage across the button terminals of active and inactive buttons can be reduced by using pulsed bias voltages. With this type of configuration, the voltage bias that is produced by the voltage bias and monitoring circuitry in the electronic device may be provided in the form of a series of square wave pulses. Logic circuitry may process a signal from one of the button terminals and the pulsed bias voltage to produce a control signal that is responsive to the state of the button.

Further features of the invention, its nature and various advantages will be more apparent from the accompanying drawings and the following detailed description of the preferred embodiments.

DETAILED DESCRIPTION

Figure 1:
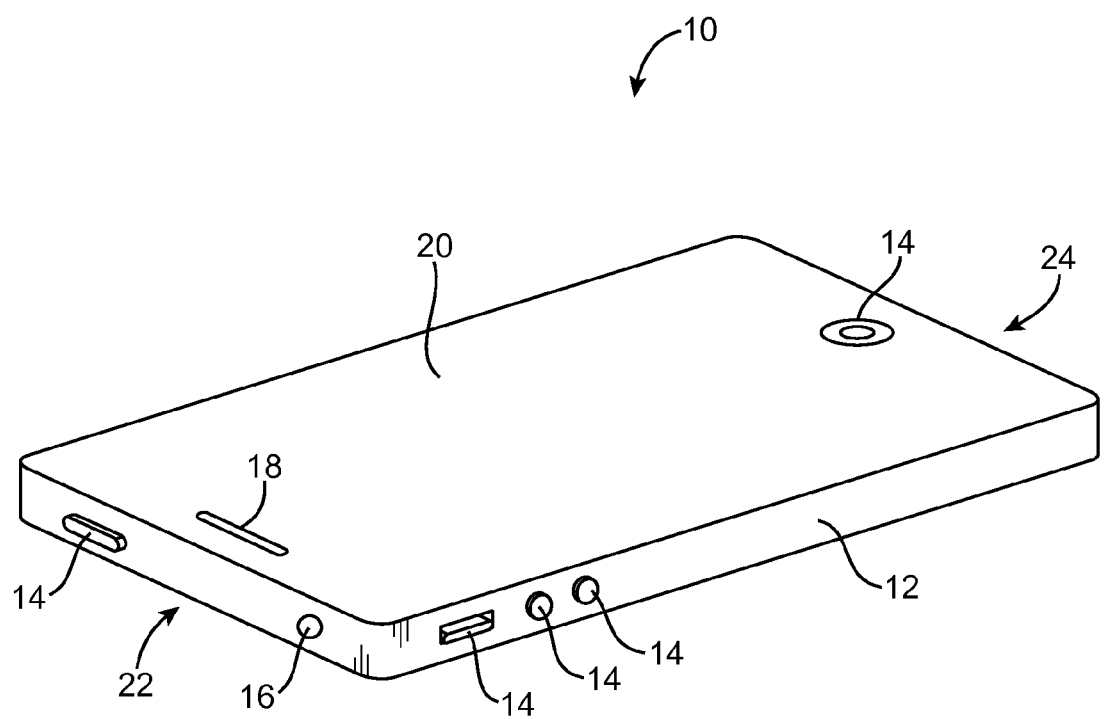
FIG. 1 is a perspective view of an illustrative electronic device having buttons and button biasing and monitoring circuitry in accordance with an embodiment of the present invention.

An illustrative electronic device with buttons is shown in FIG. 1. Electronic such as device 10 of FIG. 1 that may be provided with buttons include computers, handheld electronic devices such as cellular telephones and portable music players, portable devices such as tablet computers and laptop computers, gaming devices, and other electronic equipment. As shown in the example of FIG. 1, electronic device 10 may include a housing such as housing 12. Housing 12 may be formed from plastic, metal, fiber composites such as carbon fiber, glass, ceramic, other materials, and combinations of these materials. Housing 12 may be formed using a unibody construction in which housing 12 is formed from an integrated piece of material or may be formed from frame structures, housing walls, and other components that are attached to each other using fasteners, adhesive, and other attachment mechanisms.

A display such as display 20 may be mounted on the front face of device 10 (as an example). Display 20 may be a touch screen display. If desired, a track pad or other touch sensitive devices, a keyboard, a microphone, a speaker (e.g., a speaker associated with speaker port 18), and other user input-output devices may be used to gather user input and to supply the user with output. Ports such as port 16 may receive mating connectors (e.g., an audio plug, a connector associated with a data cable, etc.).

Buttons such as buttons 14 may be used to provide a user of device 10 with a way to supply device 10 with user input. A user may, for example, press a particular button (e.g., a menu button on the front face of device 10) to direct device 10 to display a menu of selectable on-screen options (e.g., icons) on display 20. A user may press other buttons to increase or decrease the volume of sound that is being played back to a user through a speaker in device 10 or through a pair of headphones attached to device 10 using port 16. If desired, buttons 14 may include a sleep/wake button (sometimes referred to as a sleep button or a power button) that can be pressed to alternately put device 10 into sleep and wake states or that can be held for a longer amount of time to place a device in a deep sleep mode. During sleep state operation, nonessential components may be turned off to conserve power. During wake state operation (sometimes referred to as active mode or normal operating mode), the circuitry of device 10 may be activated for use by a user.

Other buttons 14 that may be provided in device 10 include keypad keys, numeric pad keys, zoom keys, track pad keys, function keys, dedicated or semi-dedicated keys for launching an operating system function, application, or other software, fast forward, reverse, stop, pause, and other media playback keys, home buttons, buttons for controlling telephone calls (e.g., an answer call key, a hold key, a conference call key, etc.), slider switches, rocker switches, multi-position switches, help buttons, etc. In general, buttons 14 may be formed using any suitable mechanism that can open and close or otherwise alter a circuit. Examples where buttons 14 are implemented as momentary buttons using dome switches are sometimes described herein as an example. This is, however, merely illustrative.

Figure 2:
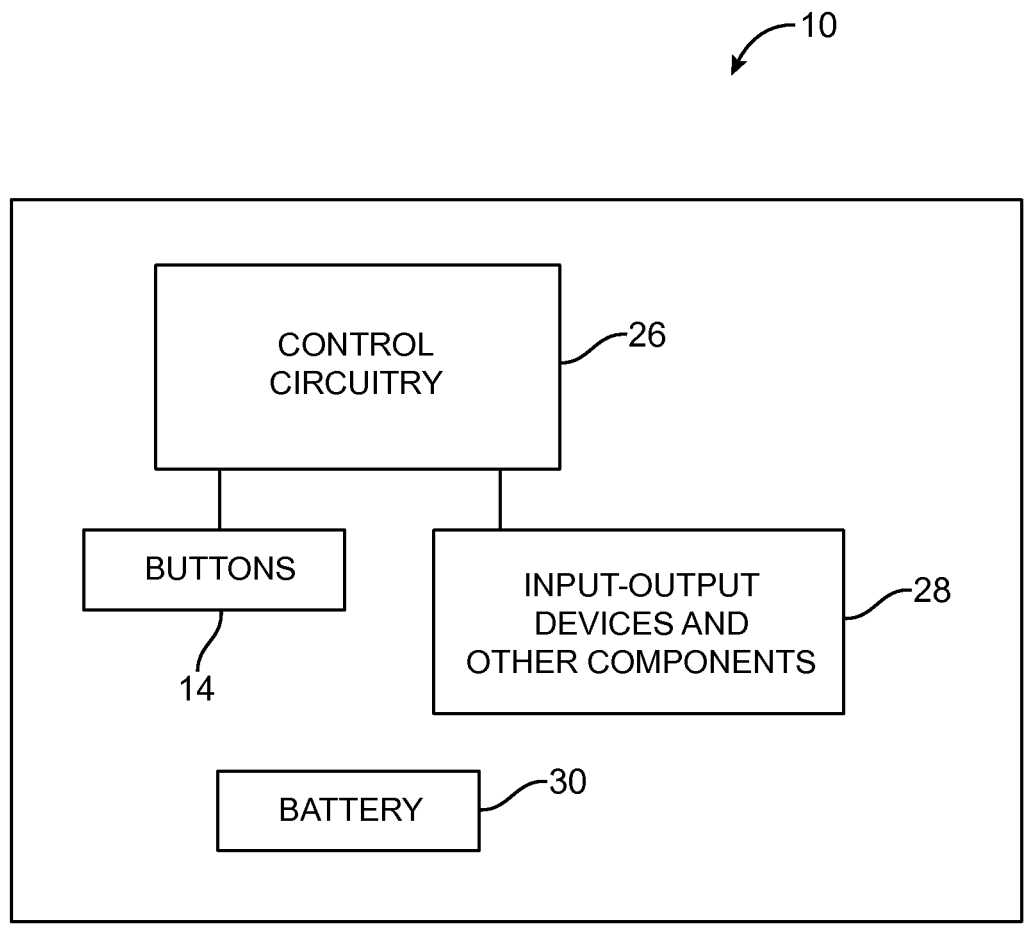
FIG. 2 is a schematic diagram of illustrative circuitry for an electronic device with buttons in accordance with an embodiment of the present invention.

FIG. 2 shows illustrative circuitry that may be used in device 10. As shown in FIG. 2, device 10 may include control circuitry 26. Control circuitry 26 may include storage such as flash memory, hard disk drive memory, solid state storage devices, other nonvolatile memory, random-access memory and other volatile memory, etc. Control circuitry 26 may also include processing circuitry. the processing circuitry of control circuitry 26 may include digital signal processors, microcontrollers, application specific integrated circuits, microprocessors, power management unit (PMU) circuits, and processing circuitry that is part of other types of integrated circuits.

Input-output devices 28 may include wireless communications circuits, displays, speakers, microphones, status indicator light-emitting diodes, sensors such as proximity sensors and accelerometers, touch screens, data port circuits coupled to data ports, analog input-output circuits coupled to audio connectors and other analog signal ports, track pads and other pointing devices, etc.

Battery 30 may be used to supply power to device 10 when device 10 is not connected to a source of alternating current (AC) power. Battery 30 may be, for example, a rechargeable lithium polymer battery. When AC power is available, device 10 can be plugged into the AC power source. Power regulator circuitry in control circuitry 26 may be used to convert AC power into DC power for powering device 10 and charging battery 30.

Buttons 14 may be coupled to control circuitry 26. The state of each button 14 may be sensed using button biasing and monitoring circuitry in control circuitry 26. When, for example, a given button is open, the high-impedance path that is created by the open button can be detected using circuitry 26. When the given button is closed, the short circuit path that is created between the terminals of the button can likewise be detected.

Buttons 14 may include movable button members (e.g., cylindrical or rectangular members of the type shown in FIG. 1 that reciprocate within holes in the sidewalls of housing 12 when actuated by a user). These button members may bear against a switch mechanism such as a mechanism based on a dome switch. With this type of arrangement, a user may open and close the switch by pressing and releasing the button. For example, in a normally opened design, a user may press a button to compress its dome switch and thereby place the dome switch and button in a closed state. Releasing the button will cause the dome switch to return to its open state. Normally closed designs may also be used.

Figure 3:
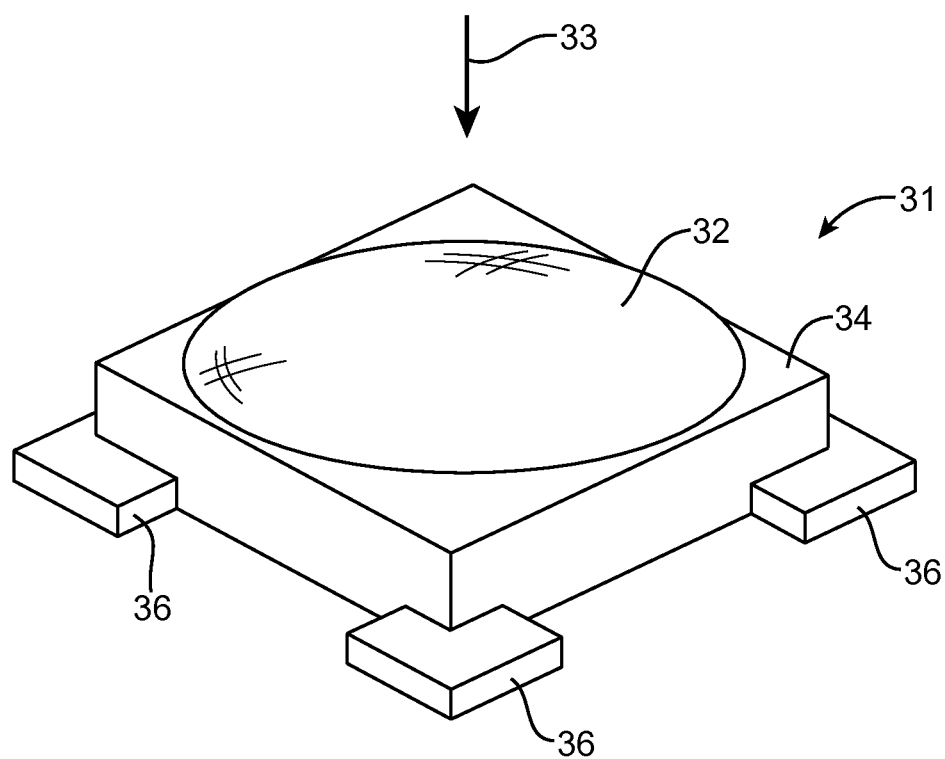
FIG. 3 is a perspective view of an illustrative dome switch structure of the type that may be used in a button in an electronic device in accordance with an embodiment of the present invention.

An illustrative dome switch of the type that may be used in buttons 14 of FIG. 1 is shown in FIG. 3. As shown in FIG. 3, dome switch 31 may have dome-shaped compressible dome member such as dome member 32. Dome member 32 may be mounted on base 34 and can be compressed when pressed in direction 33. Switch (button) terminals 36 may be may be provided on the four corners of dome switch base (housing) 34. In a typical configuration, a first pair of terminals 36 may be electrically connected and may serve as a positive terminal for switch 31 and a second pair of terminals 36 may be electrically connected and may serve as a ground terminal for switch 31. Dome switches with other numbers of terminals may also be used in buttons 14.

Figure 4:
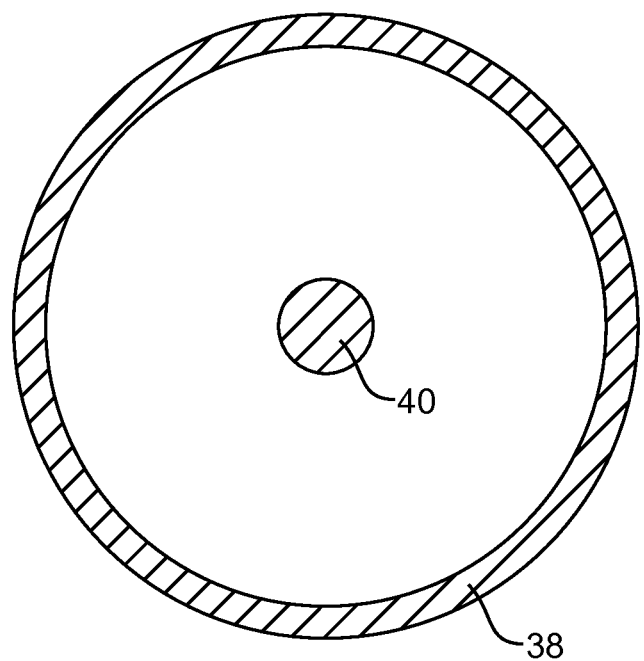
FIG. 4 is a top view of an interior portion of a dome switch showing inner and outer conductive terminals that may be included in the dome switch in accordance with an embodiment of the present invention.
Figure 5:
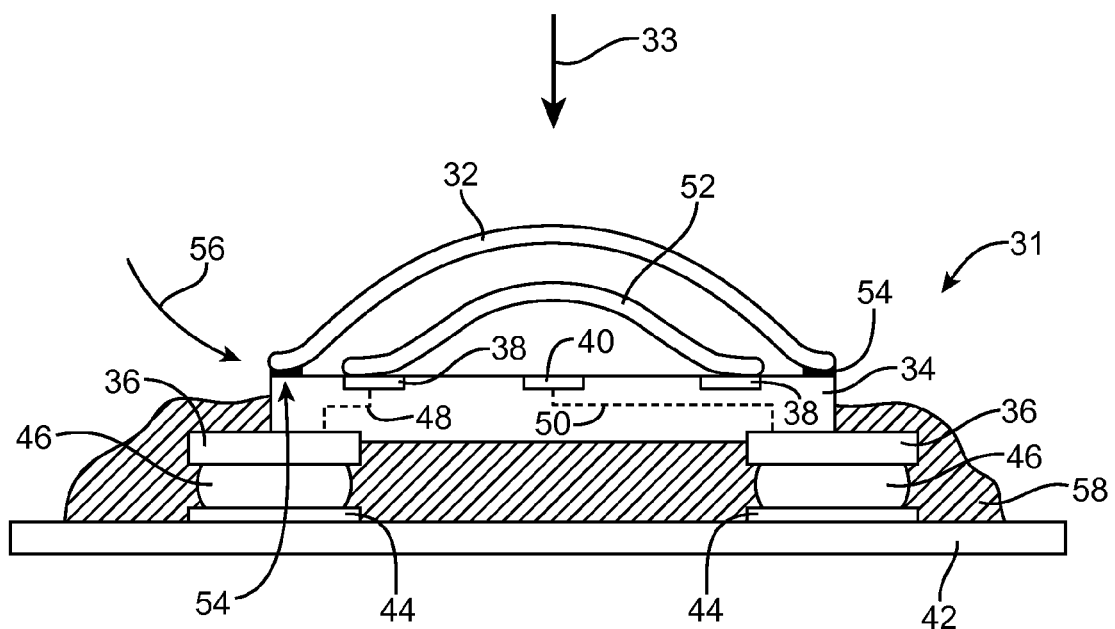
FIG. 5 is a cross-sectional side view of an illustrative dome switch having a shape of the type shown in FIG. 3 and switch terminals of the type shown in FIG. 4 in accordance with an embodiment of the present invention.

The first dome switch terminal may be electrically connected to an outer dome ring electrode such as outer ring 38 of FIG. 4. The second dome switch terminal may be electrically connected to an inner dome electrode such as inner dome electrode 40 in FIG. 4. When dome member 32 is compressed, a conductive dome structure (e.g., a polymer dome with an inner metal layer or a metal dome) that is within dome member 32 such as dome structure 52 of FIG. 5 may be compressed and may form a short circuit path between electrodes 38 and 40. As shown in FIG. 5, paths 48 and 50 may be used to connect electrodes 38 and 40 of switch 31 to respective switch terminals 36. Solder 46 may be used to electrically connect switch terminals 36 to pads 44 on substrate 42 (e.g., a flex circuit). When dome member 32 is compressed in direction 33 (e.g., by a button member associated with the button in which dome switch 31 is mounted), dome structure 52 will short terminals 38 and 40 together and will close switch 31.

To help reduce the impact of exposure to moisture, underfill material 58 may be used to seal pads 44 and terminals 36. Nevertheless, portions of switch 31 such as the edges of dome member 32 may remain exposed. Adhesive 54 may be used to seal the edges of dome member 32 to base 34. The seal that is formed by adhesive 54 may not, however, be perfectly moisture proof. This may allow moisture to enter the interior of dome switch 31 in the vicinity of electrodes (terminals) 38 and 40 along paths such as path 56. When device 10 is not powered, no voltage will appear across terminals 38 and 40. When device 10 is powered, however, the biasing circuits that are used to monitor the state of switch 31 may potentially apply a voltage across terminals 38 and 40. This voltage is typically referred to as being a button bias voltage, because this voltage biases the button terminals so that the state of the button can be detected using monitoring circuitry.

Figure 6:
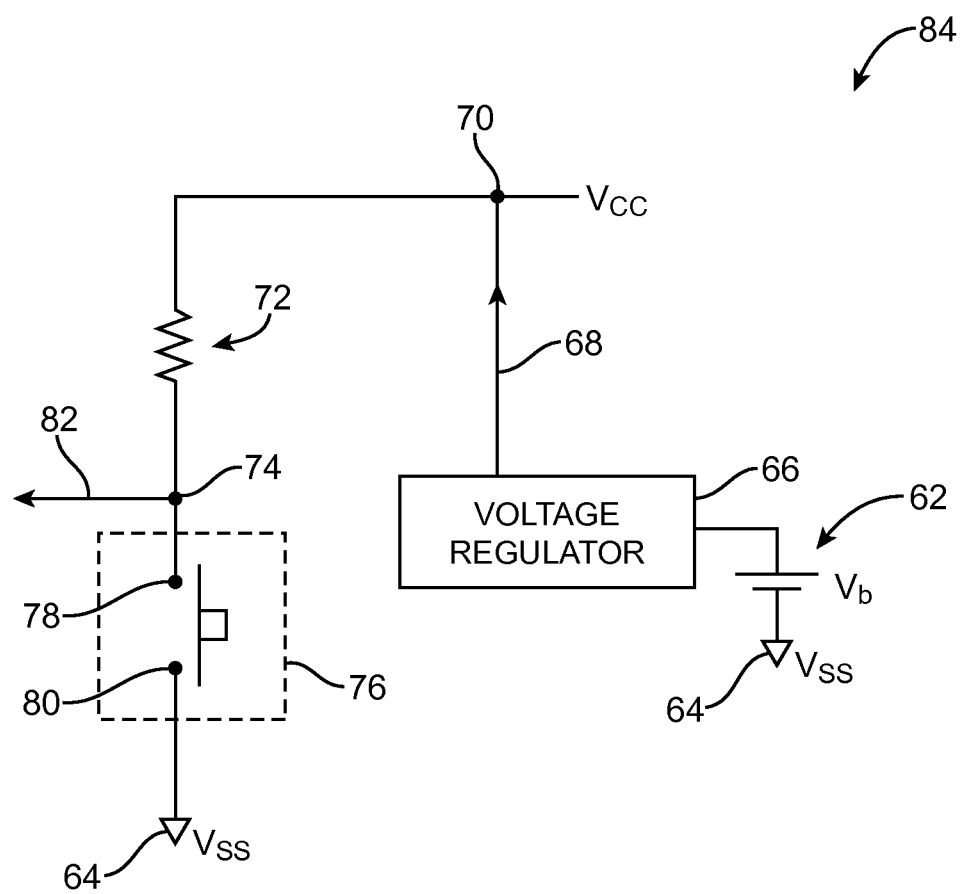
FIG. 6 is a circuit diagram of a conventional button circuit that uses a fixed button bias voltage to detect button activity from a button.

A conventional electronic device button biasing and monitoring circuit is shown in FIG. 6. As shown in circuit 84 of FIG. 6, battery power is supplied by battery 62 at battery voltage Vb between ground terminal 64 and voltage regulator 66. Voltage regulator 66 may produce a corresponding fixed positive power supply voltage Vcc to positive power supply terminal 70 via path 68. Resistor 72 applies voltage Vcc to switch terminal 78 while ground terminal 64 applies ground voltage Vss (0 volts) to switch terminal 80. When dome switch 76 is open, there is an open circuit between terminals 78 and 80. When switch 76 is closed, there is a short circuit between terminals 78 and 80. With this type of arrangement, the state of switch 76 and its associated button is represented by the voltage on terminal 74 and output line 82. When switch 76 is open, the voltage on line 82 is at a logic high level of Vcc. When switch 76 is closed, terminals 78 and 80 are shorted together and the voltage on line 82 is a logic low level of Vss.

The continuous application of the constant Vcc voltage of circuit 84 across terminals 78 and 80 accelerates the undesired growth of dendrites in the presence of moisture in switch 76. This can cause switch 76 to develop a permanent short circuit. Failures of this type may render a cellular telephone or other device containing switch 76 inoperable.

The problems associated with dendrite formation in conventionally biased buttons can be addressed by controlling the voltage that is applied across terminals 38 and 40 of switch 31 and other such button terminals in device 10. For example, instead of applying a fixed DC voltage, the voltage across terminals 38 and 40 can be pulsed. The average DC voltage level associated with a pulsed bias voltage will be less than the average DC voltage level associated with a fixed bias voltage of the same peak magnitude. As a result, use of bias voltage pulsing schemes can help to reduce the acceleration of dendrite growth that is experience in the presence of non-zero button bias voltages.

If desired, the pulsed bias voltage or a fixed DC bias voltage can be applied selectively. During periods of time in which a given button is active, the pulsed (or fixed) bias voltage may be applied. During periods of time in which the given button is inactive (i.e., when device 10 is operating in a mode in which the state of the given button is immaterial and is not being monitored), the biasing circuitry can apply a ground voltage (i.e., a zero-volt bias voltage) or other reduced voltage across the terminals of the button.

Figure 7:
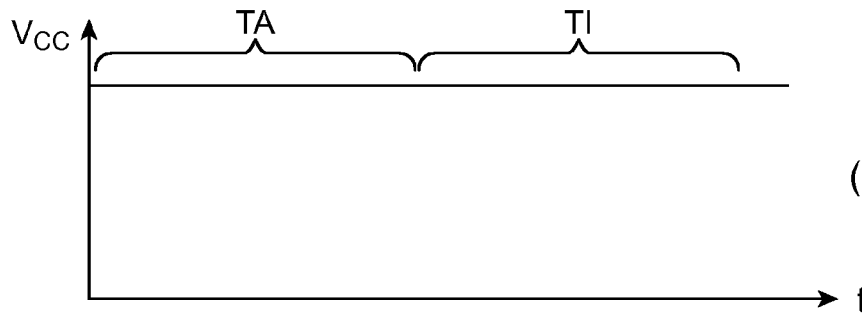
FIG. 7 is a graph showing how the button bias voltage of the conventional button circuit of FIG. 6 is constant as a function of time.

FIG. 7 is a graph showing how a fixed button bias voltage Vcc is applied across terminals 78 and 80 by conventional circuit 84 of FIG. 6 during both periods of time such as time period TA when switch 76 is active and periods of time such as time period TI when switch 76 is inactive. During time period TA, circuit 84 needs to use voltage Vcc to monitor the state of switch 76 and produce a corresponding output signal on line 82 that is indicative of the state of switch 76. During time period TI, however, the electronic device containing circuit 84 does not monitor the status of the signal on line 82. The state of switch 76 during inactive time period TI is immaterial and does not influence the operation of the electronic device. Applying a fixed voltage Vcc during time period TI therefore needlessly accelerates dendritic growth and increases the likelihood that conventional switch 76 will fail.

Reductions to the time-averaged magnitude of the bias voltage Vcc can be made by pulsing Vcc and/or by taking Vcc to ground or other reduced voltage during certain periods of time. Control circuitry 26 (FIG. 2) may maintain information on the current operating mode for device 10. For example, control circuitry 26 can determine which software is being run on control circuitry 26 and can determine which device functions are available to a user. In some modes of operation, it may be desirable to have most or all of the buttons of the device available for immediate use by the user. In other modes of operation, however, certain buttons are of little or no use. The states of buttons that are not of present use to the user can therefore be ignored and the bias voltage Vcc that is being applied to those buttons can be grounded or otherwise reduced to minimize dendritic growth.

Mode-dependent button bias voltage changes can be made by control circuitry 26 in real time, based on the current state of device 10. As different software programs are run on device 10 and/or as a user activates and deactivates various software features, different sets of buttons are needed (and are therefore considered active). The remaining buttons (i.e., the buttons that are not needed or that provide little added user benefit), can be considered inactive buttons and can be biased with modified Vcc profiles. The time-averaged magnitude of bias voltage Vcc can also be reduced for buttons that are active (e.g., by using a pulsed button biasing scheme).

Figure 8:
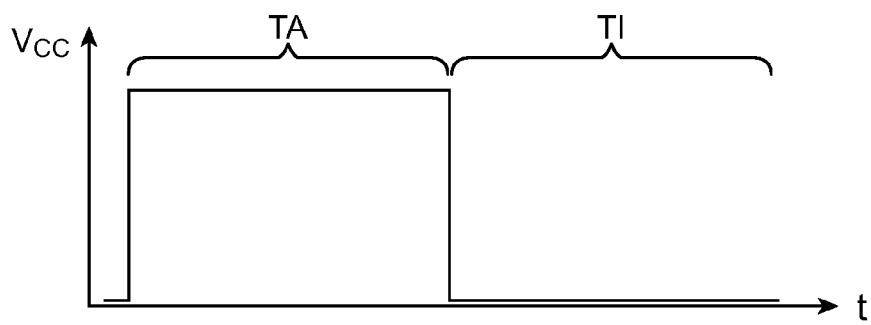
FIG. 8 is a graph showing how a button bias voltage may be changed as a function of time so that there is a reduced or eliminated button bias voltage during times when a button is not in use in accordance with an embodiment of the present invention.

FIG. 8 shows an illustrative time-varying Vcc profile that may be used when biasing buttons 14. During time periods such as TA in which a button is active, Vcc may be maintained at a fixed positive voltage level. During time periods such as TI in which a button is not active (i.e., when it is considered impossible or unlikely that the button will be pressed by the user to supply user input to device 10 or when it is otherwise desired to ignore presses of the button), Vcc may be taken to a reduced voltage level such as ground (e.g., a Vss level of 0 volts).

Figure 9:
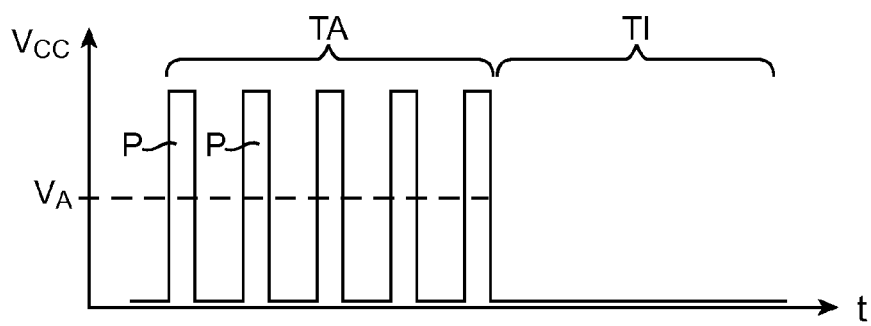
FIG. 9 is a graph showing how a button bias may be pulsed during periods of time when a button is active and may be turned off completely during periods of time when the button is inactive in accordance with an embodiment of the present invention.

FIG. 9 shows an illustrative time-varying Vcc bias voltage in which Vcc includes square wave voltage pulses P during active time period TA and is held at a reduced fixed voltage such as a ground voltage Vss (e.g., 0 volts) during inactive time period TI. Due to the pulsed nature of the Vcc profile during active period TA, the time-averaged magnitude of Vcc during period TA will be reduced (e.g., to average voltage Va of FIG. 9) relative to its peak magnitude. The magnitude of Va is less than that of the peak Vcc value, so dendritic growth will be reduced relative to a scenario using a fixed bias voltage at the peak voltage level. The elimination of non-zero bias voltages during inactive time period TI may further reduce dendritic growth.

Figure 10:
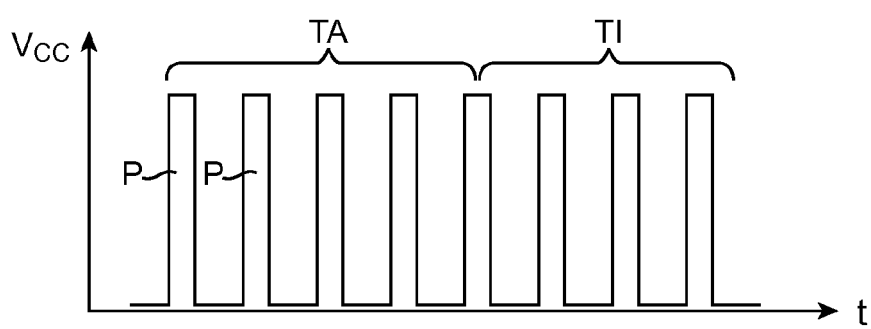
FIG. 10 is a graph showing how a button bias may be pulsed during periods of button activity and inactivity in accordance with an embodiment of the present invention.

If desired, a time-varying Vcc button bias profile of the type shown in FIG. 10 may be used to bias buttons 14 in device 10. In the arrangement of FIG. 10, Vcc may be pulsed both during active time periods such as time period TA and inactive time periods such as time period TI. Even though Vcc is not taken to ground voltage Vcc during the entirety of inactive time period TI, the time-averaged magnitude of Vcc can be minimized using pulsed biasing.

Pulses such as pulses P may have a width such as a width greater than 100 ms, less than 100 ms, less than 10 ms, less than 5 ms, less than 2 ms, less than 0.5 ms, etc. The time period between adjacent pulses may be less than 50 ms, less than 100 ms, less than 200 ms, greater than 100 ms, greater than 200 ms, 20-200 ms, 1-100 ms, etc. The duty cycle of pulses P (i.e., the fraction of time that Vcc is high) may be greater than 75%, less than 75%, less than 50%, less than 20%, less than 10%, or less than 5% (as examples).

Control circuitry 26 may control Vcc to produce a Vcc profile of the type shown in FIG. 8, of the type shown in FIG. 9, of the type shown in FIG. 10, or other suitable time-varying Vcc profiles that minimize dendritic growth.

Figure 11:
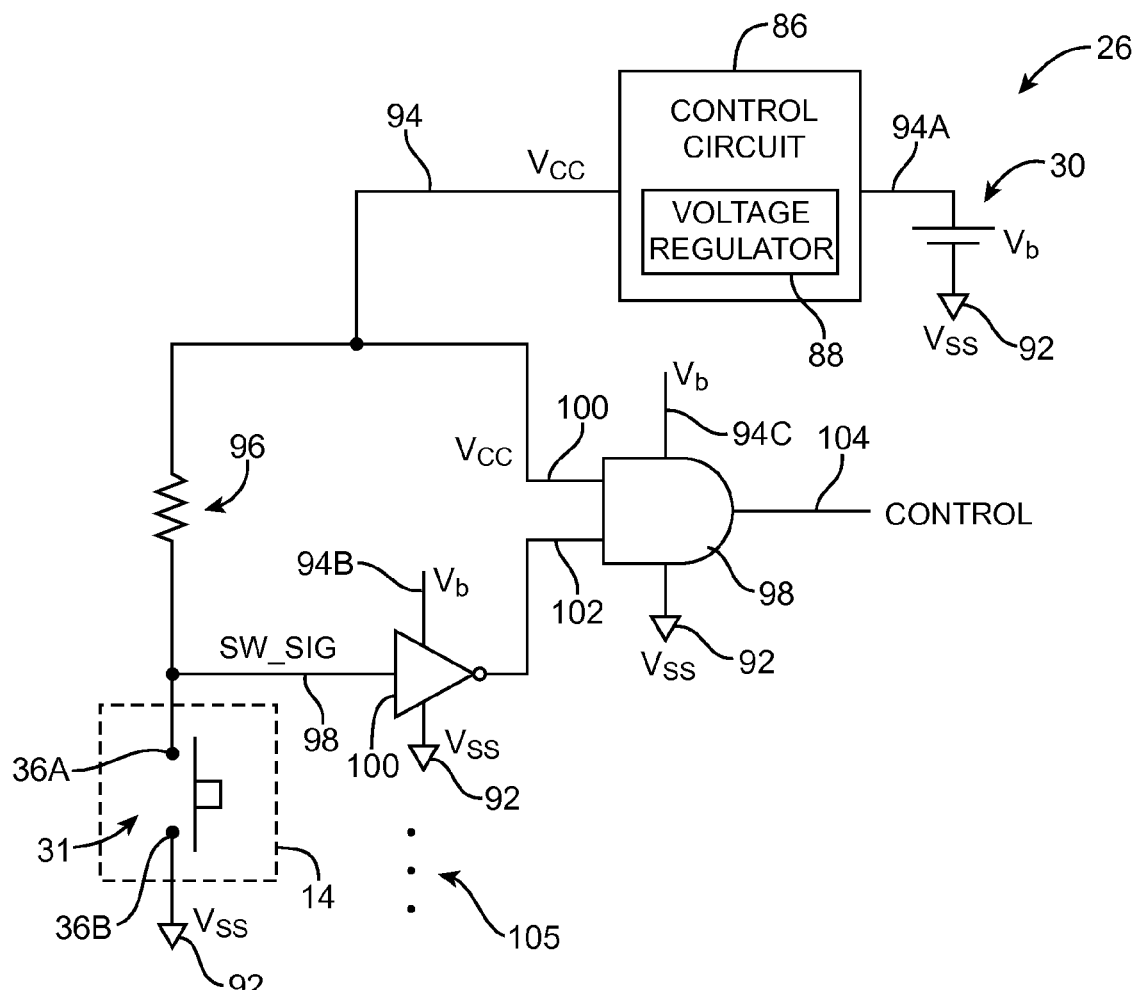
FIG. 11 is a circuit diagram of illustrative circuitry that may be used to provide buttons with time-varying bias voltages in accordance with an embodiment of the present invention.

FIG. 11 is a circuit diagram of illustrative circuitry that may be used in controlling Vcc and monitoring the status of a button during various modes of device operation. As shown in FIG. 11, control circuitry 26 may receive battery power Vb from battery 30 on battery power supply lines 94A, 94B, and 94C. Battery 30 may have an output voltage of about 1 to 4 volts (as an example). Battery voltage Vb may be regulated using voltage regulator circuitry before being applied to lines 94A, 94B, and 94C (e.g., using a power management unit that is part of a stand-alone power management integrated circuit or that is part of a larger integrated circuit such as a system-on-chip integrated circuit). Control circuit 86 may receive voltage Vb and may use controllable voltage regulator circuitry 88 to produce a time-varying voltage Vcc on output path 94. Voltage Vcc may have a peak voltage magnitude of about 0.5 to 3 volts (as an example). Other voltages may be used if desired.

Voltage Vcc may be routed to resistor 96 or other circuit load element via path 94. Input 100 of AND gate 98 may receive voltage Vcc from path 94. Resistor 96 may apply voltage Vcc across terminals 36A and 36B of switch 31 and button 14. Ground terminals 92 of control circuitry 26 may be maintained at a ground voltage Vss of 0 volts (as an example).

Circuitry 26 may monitor the state of signal SW_SIG on path 98. When button 14 is open, the path between terminals 36A and 36B will be open circuited. In this situation, signal SW_SIG will track voltage Vcc. When button 14 is closed, terminals 36A and 36B will be shorted together, pulling SW_SIG to ground voltage Vss.

Figure 12:
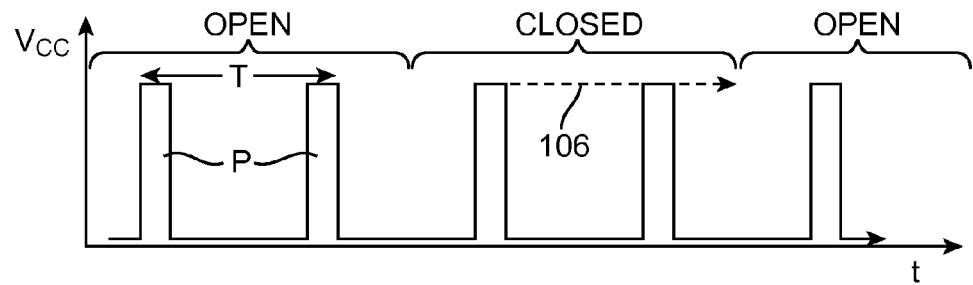
FIG. 12 is a graph of an illustrative modulated button bias voltage that may be provided using a circuit of the type shown in FIG. 11 in accordance with an embodiment of the present invention.
Figure 13:
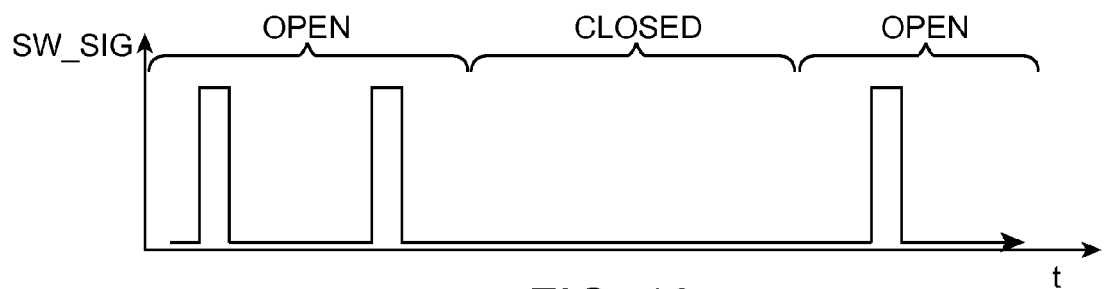
FIG. 13 is a graph showing a switch signal that may be produced when a switch is opened and closed while being biased using a bias voltage of the type shown in FIG. 12 in accordance with an embodiment of the present invention.

Using voltage regulator 88 in control circuit 86, control circuitry 26 may pulse voltage Vcc, as shown in the graph of FIG. 12. During times in which button 14 is open, signal SW_SIG will track Vcc, as shown in the graph of FIG. 13. During times in which button 14 is closed, terminal 36A will be connected to ground voltage Vss and SW_SIG will be equal to ground voltage Vss (e.g., 0 volts, as shown in the "closed" period of FIG. 13).

Inverter 100 inverts the signal SW_SIG to produce an inverted version of SW_SIG on input 102 of AND gate 98. Gate 98 may produce an output signal CONTROL on output 104 in response to the received values of Vcc on input 100 and the inverted version of SW_SIG on input 102. As indicated by dots 105, there may be a separate independently controlled biasing circuit for each respective button 14 in device 10 and each biasing circuit may produce a respective CONTROL signal at its output for processing by control circuitry 26.

Figure 14:
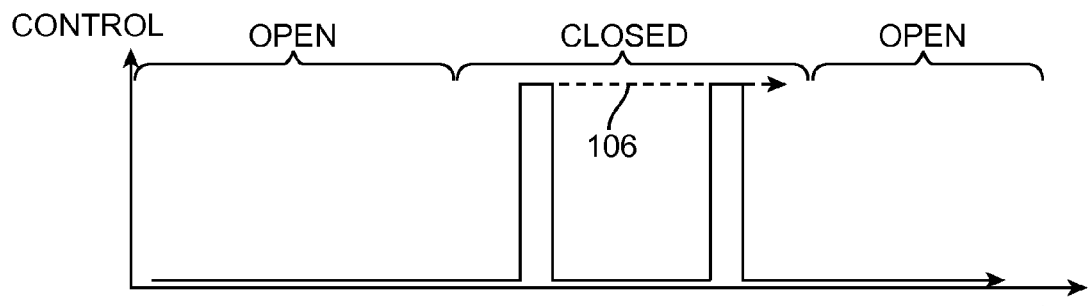
FIG. 14 is a graph of an illustrative output control signal representing button status that may be generated using a circuit of the type shown in FIG. 11 in response to button signals of the type shown in FIGS. 12 and 13.

As shown in FIG. 14, CONTROL will generally have a logic low value (e.g., 0 volts) during periods of time in which button 14 is in its open state, because the inputs to AND gate 98 are complements of each other during these periods of time. When button 14 is in its closed state, CONTROL will be low until the occurrence of the first Vcc pulse. When the Vcc pulse is placed on terminal 36A while button 14 is closed, the inverted version of SW_SIG on input 102 will be a constant logic high value. As a result, the signal CONTROL at the output of AND gate 98 will track the voltage Vcc on input 100 of AND gate 98, as shown in the "closed" period of the trace of FIG. 14.

If desired, control circuit 86 may hold the value of Vcc high for a given period of time (e.g., a fraction of a second or a few seconds) whenever a low-to-high CONTROL signal transition is detected (see, e.g., dashed line 106 of FIG. 12 and the resulting logic high CONTROL signal of dashed line 106 in FIG. 14). Control circuitry 26 can debounce the signal CONTROL by ignoring the first portion of the CONTROL pulse (e.g., the first few milliseconds after the rising edge of CONTROL).

The signal CONTROL reflects button press activity on button 14 and can be used by control circuitry 26 to control the operation of device 10. For example, if circuitry 26 detects that the user of device 10 has pressed an up-volume button, control circuitry 26 can increase the volume of media that is being played back by device 10. If circuitry 26 detects that a menu button has been pressed, control circuitry 26 can display a screen of selectable menu items on display 20, etc.

During use of device 10, the set of buttons that are needed to receive input from the user may change as a function of time. For example, to wake device 10 from sleep, a user may be accustomed to pressing a sleep/wake button (power button) or a menu button. A user may not, however, be expecting that an accidental press of an up or down volume button will wake device 10 from sleep. When device 10 is in a sleep state, it may therefore be necessary to monitor the status of the menu button and the sleep/wake button, but it may not be necessary or desirable to monitor the status of buttons such as up and down volume buttons. When device 10 is operated in other modes, the set of buttons that need to be monitored to receive input from the user may be different. When, for example, device 10 is being operated in a fully active mode, all of buttons 14 may be monitored to ensure that device 10 is fully functional and can receive input from any available button (e.g., a sleep/wake button to place the device to sleep, a menu button, and up/down volume buttons).

Figure 15:
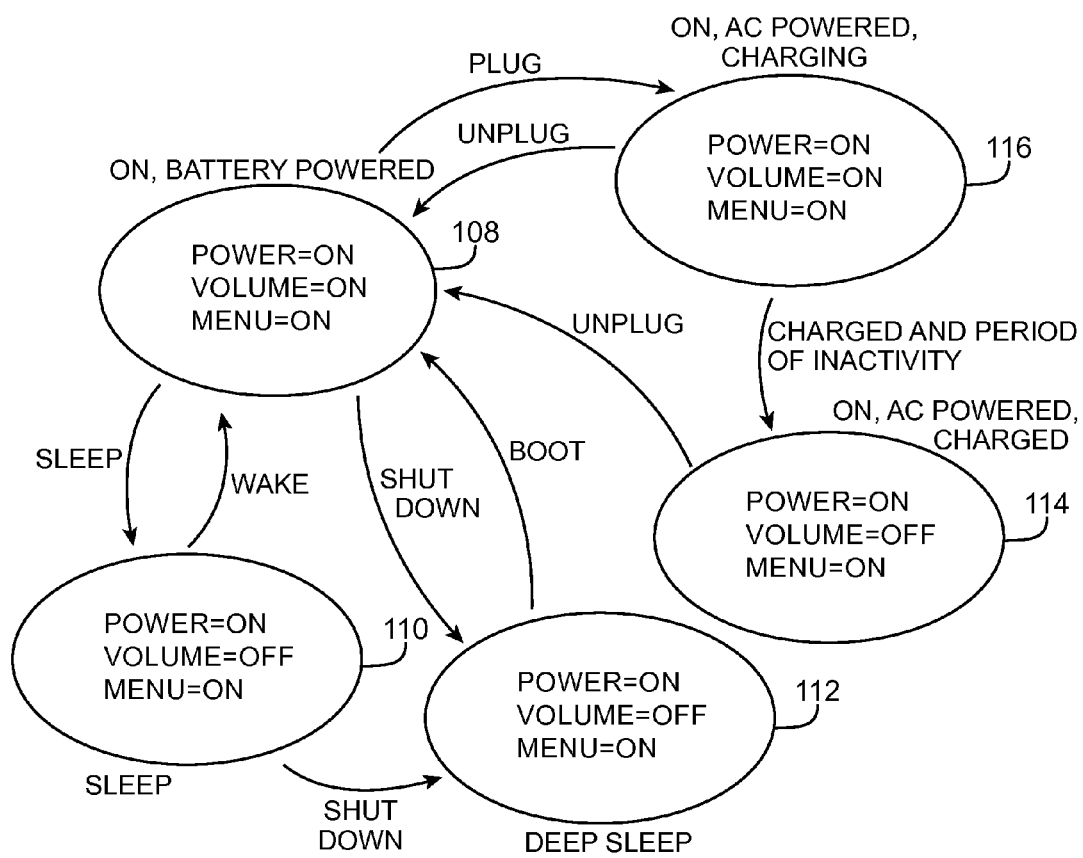
FIG. 15 is a diagram showing how button bias voltages for various buttons in an electronic device of the type shown in FIG. 1 may be varied by an electronic device as the electronic device transitions between operating modes in accordance with an embodiment of the present invention.

FIG. 15 is a diagram showing how device 10 may adjust button bias circuits for various buttons (i.e., control circuitry 26 of FIG. 11) so that the pattern of bias voltages Vcc that is used in monitoring the buttons changes in various modes. In some modes, such as modes in which device 10 is fully activated (e.g., mode 108 of FIG. 15) control circuitry 26 may provide a fixed, pulsed, or other non-zero bias voltage to all of buttons 14. In other modes, such as when device 10 is in sleep mode (e.g., mode 110 of FIG. 15), device 10 may adjust the button bias circuits of control circuitry 26 so that fewer buttons are monitored. By applying non-zero bias voltages to only a subset of buttons in certain situations, bias-voltage-dependent dendritic grown in the unbiased buttons can be reduced.

As shown in FIG. 15, device 10 may be plugged into a wall outlet to receive AC power and thereby charge battery (mode 116). In mode 116, AC wall power may be converted into DC power using a power converter in device 10. The DC power may be used to charge battery 30 and may be used to power device 10. In modes such as mode 116 (e.g., modes in which device 10 is attached to a wall outlet and is charging battery 30), control circuitry 26 can bias and monitor the status of a power button (sometimes referred to as a sleep/wake button), can bias and monitor the status of volume buttons, and can bias and monitor the status of a menu button. The bias that is used may be, for example, a fixed voltage (see, e.g., bias Vcc in active time period TA of FIG. 8) or a pulsed bias (see, e.g., bias Vcc in region TA of FIG. 9).

When battery 30 has become fully charged and a period of inactivity has been detected by control circuitry 26, device 10 may enter mode 114. In mode 114, control circuitry 26 can continue to bias the power and menu buttons (e.g., at a fixed positive voltage or a pulsed voltage), but may apply a voltage of Vss to the button terminals of the volume buttons in device 10. This helps reduce dendritic growth in the volume buttons.

When a user is operating in mode 116 or 114, a user may unplug device 10 from AC power. When this change is detected by circuitry 26, device 10 may transition from mode 116 or 114 to operating mode 108. Device 10 may also transition into operating mode 108 when woken from sleep state 110 or deep sleep state 112. Operating mode 108 may sometimes be referred to as an active mode, normal operating mode, or fully operational mode. In this type of operating mode, most or all of buttons 14 in device 10 may be active. For example, control circuitry 26 may apply a non-zero bias voltage Vcc (fixed or pulsed) to the power button, to the volume buttons, and to the menu button. When device 10 is operating in mode 108, a user may plug device 10 into AC power and, when this change is detected by circuitry 26, device 10 may transition from mode 108 to mode 116.

Because the power button is active in mode 108, control circuitry 26 can detect user button presses on the power button. With one suitable arrangement, a user may press and hold the power button for a first period of time (e.g., a fraction of a second) to direct circuitry 26 to transition device 10 to a sleep state (mode 110). A user may press and hold the power button for a second period of time (e.g., a second or more) to direct circuitry 26 to transition device 10 to a deep sleep state such as mode 112 (e.g., after the user responds to an on-screen confirmation option).

In modes 110 and 112, control circuitry 26 may not need to monitor the status of as many buttons as in mode 110. For example, in modes 110 and 112, control circuitry 26 may only bias and monitor the state of the power button and the menu button. If a long press of the power button is detected during mode 108, control circuitry 26 may place device 10 in deep sleep mode 112 (e.g., after a user responds to an on-screen confirmation option). During sleep mode 110, fewer circuits may be active in device 10 than in active mode 108 to conserve power. Deep sleep mode 112 may involve deactivating more circuitry to conserve additional power relative to sleep mode 110.

If activity on either the power or menu button is detected when device 10 is in mode 110 or mode 112, control circuitry 26 can transition device 10 to an active state (mode 108) and can begin biasing and monitoring all buttons 14 (e.g., power, volume, and menu). Because it is not necessary to monitor the status of the volume buttons in modes 110 and 112, control circuitry 26 can deactivate the bias voltage (i.e., Vcc can be held at Vss as shown in inactive time period TI of FIG. 8). With bias voltage Vcc at Vss, dendritic growth in the volume buttons may be reduced.

Device 10 may implement selective button biasing schemes of the type described in connection with FIG. 15 in a device with one to three buttons, in a device with one to five buttons, in a device with two or more buttons, in a device with more than three or more than four buttons, etc. Whenever a mode of operation is entered that does not involve the monitoring of a button or buttons, the biasing voltages Vcc (e.g., a fixed or pulsed voltage Vcc) for those buttons may be temporarily taken to Vss or other suitable reduced voltage relative to the nominal Vcc maximum level used during normal biasing.

In conjunction with a button biasing scheme that adjusts which buttons are biased depending on its current operating mode or as part of a button biasing scheme in which buttons are biased substantially equally during both active and inactive periods, buttons may be biased by applying pulsed voltages across the terminals of the buttons. Voltage bias pulses may be square wave pulses or may have other suitable time-varying signal shapes, may have duty cycles less than 100% to reduce average voltage levels, may have regularly spaced pulses or pulses that are spaced at irregular intervals, or may have other suitable characteristics.

Modes 108, 110, 112, 114, and 116 of FIG. 15 are merely illustrative examples. In general, device 10 may operate in any number of different modes. In some of the modes of device 10, device 10 may implement selective button biasing schemes for one or more buttons. Device 10 may implement selective button biasing schemes for buttons in device 10 such as menu keys, sleep keys, volume keys, lock/unlock keys, keypad keys, numeric pad keys, zoom keys, track pad keys, function keys, dedicated or semi-dedicated keys for launching an operating system function, application, or other software, fast forward, reverse, stop, pause, and other media playback keys, home buttons, buttons for controlling telephone calls (e.g., an answer call key, a hold key, a conference call key, etc.), slider switches, rocker switches, multi-position switches, help buttons, etc.

The foregoing is merely illustrative of the principles of this invention and various modifications can be made by those skilled in the art without departing from the scope and spirit of the invention.

What is claimed is:

1. An electronic device, comprising:
   a plurality of buttons each of which has button terminals; and
   a control circuitry:
      that is configured to apply a time-varying pulsed bias voltage across the button terminals of at least first and second buttons in the plurality of buttons during a first mode of operation of the electronic device, wherein a time-averaged magnitude of the time-varying pulsed bias voltage during the first mode of operation is less than a fixed bias voltage, and
      that is configured to apply a fixed zero voltage across the button terminals of the first button while applying the time-varying pulsed bias voltage across the button terminals of the second button during a second mode of operation of the electronic device.

2. The electronic device defined in claim 1 wherein the first button comprises a volume button.

3. The electronic device defined in claim 1 wherein the second button comprises a menu button.

4. The electronic device defined in claim 2 wherein the second button comprises a sleep/wake button.

5. The electronic device defined in claim 1 wherein the plurality of buttons each include a respective dome switch having electrodes coupled to the button terminals of that button.

6. The electronic device defined in claim 1 wherein at least one of the first and second buttons has first and second button terminals, wherein the button is operable in an open state in which an open circuit is formed between the first and second button terminals and is operable in a closed state in which the first and second button terminals are short circuited together; and
   the control circuitry is further configured to determine whether the button is in the open state or the closed state while the time varying pulsed bias voltage is being applied across the button terminals.

7. The electronic device defined in claim 6 wherein the control circuitry comprises a logic circuit having a first input that is coupled to a bias voltage path, a second input that is coupled to the first button terminal, and an output at which a corresponding signal is generated representing whether the button is in the open state or the closed state.

8. The electronic device defined in claim 7 wherein the logic circuit comprises an AND gate.

9. The electronic device defined in claim 6 wherein the control circuitry is configured to generate the pulsed bias voltage at a duty cycle of less than 20%.

10. The electronic device defined in claim 9 wherein the control circuitry is configured to generate pulses in the pulsed bias voltage that have pulse widths of less than 10 ms each.

11. The electronic device defined in claim 6 further comprising additional buttons, wherein the control circuitry is configured to prevent application of the pulsed bias voltage to the button when the electronic device is operating in an operating mode in which input from the button is not monitored while input from the additional buttons is monitored.

12. The electronic device defined in claim 11 wherein the control circuitry is configured to generate square wave pulses in the pulsed bias voltage.

13. A method for operating an electronic device that has a plurality of buttons each of which has button terminals and each of which is operable in open and closed positions, the method comprising:
   operating the electronic device in a first mode in which a time-varying pulsed bias voltage is applied across the button terminals of each of the plurality of buttons, wherein a time-averaged magnitude of the time-varying pulsed bias voltage during the first mode of operation is less than a fixed bias voltage; and
   operating the electronic device in a second mode in which a bias voltage of zero volts is applied across the button terminals of a first of the plurality of buttons and in which the time-varying pulsed bias voltage is applied across the button terminals of a second of the plurality of buttons.

14. The method defined in claim 13 wherein operating the electronic device in the first mode comprises operating the electronic device in a fully operational mode in which activity on each of the plurality of buttons is monitored by a control circuitry in the electronic device.

15. The method defined in claim 14 wherein operating the electronic device in the second mode comprises operating the electronic device in a sleep mode in which button press activity on the second of the plurality of buttons is monitored by the control circuitry in the electronic device using the time-varying pulsed bias voltage and in which button press activity on the first of the plurality of buttons is not monitored.

16. The method defined in claim 13 wherein the first button comprises a volume button and wherein operating the electronic device in the second mode comprises operating the electronic device in a sleep mode without monitoring whether the volume button is in the closed or open position.

17. The method defined in claim 13, wherein the operating the electronic device in the first mode comprises
   monitoring a button using the applied time-varying pulsed bias voltage to determine whether the button is in the open or closed position.

18. The method defined in claim 13 wherein operating the electronic device in the first mode comprises applying square wave pulses with a duty cycle of less than 20% across the button terminals.

19. The method defined in claim 13 further comprising:
   monitoring signals on one of the button terminals using a logic circuit that receives the time-varying pulsed bias voltage as an input.

20. The method defined in claim 19 wherein the electronic device comprises an additional button having first and second terminals and wherein monitoring the signals comprises monitoring the signals using the time-varying pulsed bias voltage while applying a zero-volt bias voltage across the first and second terminals of the additional button.

* * * * *